(12) United States Patent
Woo et al.

(10) Patent No.: US 10,905,015 B2
(45) Date of Patent: Jan. 26, 2021

(54) CHIP COMPONENT HAVING GROOVE FORMED THEREIN

(71) Applicant: LG CHEM, LTD., Seoul (KR)

(72) Inventors: Ga Young Woo, Gyeongsangbuk-do (KR); Young Su Son, Chungcheongbuk-Do (KR); Byeong Geon Kim, Gyeonggi-do (KR)

(73) Assignee: LG Chem, Ltd., Seoul (KR)

( * ) Notice: Subject to any disclaimer, the term of this patent is extended or adjusted under 35 U.S.C. 154(b) by 330 days.

(21) Appl. No.: 15/943,944

(22) Filed: Apr. 3, 2018

(65) Prior Publication Data
US 2018/0332715 A1    Nov. 15, 2018

(30) Foreign Application Priority Data

May 10, 2017 (KR) .......................... 10-2017-0058242

(51) Int. Cl.
| | | |
|---|---|---|
| *H01L 23/13* | (2006.01) | |
| *H01L 23/498* | (2006.01) | |
| *H05K 1/11* | (2006.01) | |
| *H05K 1/18* | (2006.01) | |
| *H05K 3/10* | (2006.01) | |
| *H05K 3/34* | (2006.01) | |

(52) U.S. Cl.
CPC ............ *H05K 3/341* (2013.01); *H01L 23/13* (2013.01); *H01L 23/49833* (2013.01); *H05K 1/111* (2013.01); *H05K 1/183* (2013.01); *H05K 3/107* (2013.01); *H05K 3/3442* (2013.01); *H05K 2201/0373* (2013.01); *H05K 2201/09181* (2013.01); *H05K 2201/10984* (2013.01)

(58) Field of Classification Search
CPC ............ H01G 2/06; H01G 4/12; H01G 4/232; H01G 4/30; H01L 23/13; H01L 23/49833; H01L 23/498; H05K 1/111; H05K 1/183; H05K 1/11; H05K 1/18; H05K 1/162; H05K 1/185; H05K 1/16; H05K 1/181; H05K 3/107; H05K 3/341; H05K 3/3442; H05K 3/10; H05K 3/34; H05K 2201/0373; H05K 2201/09181; H05K 2201/10984; Y02P 70/50
USPC .......................... 361/301.1, 301.4; 174/260
See application file for complete search history.

(56) References Cited

U.S. PATENT DOCUMENTS

| | | | | |
|---|---|---|---|---|
| 6,831,824 B1 * | 12/2004 | Devoe | ................... | H01G 2/065 361/303 |
| 2014/0311789 A1 * | 10/2014 | Han | ........................ | H01G 4/12 174/260 |
| 2016/0217926 A1 * | 7/2016 | Jun | ........................ | H01G 4/228 |

FOREIGN PATENT DOCUMENTS

| | | | | |
|---|---|---|---|---|
| JP | 2001-332437 A | 11/2001 | | |
| JP | 2001332437 A | * 11/2001 | ............... | H01G 2/06 |

(Continued)

OTHER PUBLICATIONS

Office Action dated Jul. 15, 2019, issued in corresponding Korean Patent Application No. 10-2017-0058242.

*Primary Examiner* — Timothy J Thompson
*Assistant Examiner* — Guillermo J Egoavil
(74) *Attorney, Agent, or Firm* — Morgan, Lewis & Bockius LLP

(57) ABSTRACT

The present disclosure relates to a laminated-type chip component, and more particularly, to a laminated-type chip component which can be more stably bonded by forming a groove filled with solder in a region in which an external electrode terminal of the laminated-type chip is soldered and thereby increasing the area of soldering.

15 Claims, 7 Drawing Sheets

(56) References Cited

FOREIGN PATENT DOCUMENTS

| | | | | | |
|---|---|---|---|---|---|
| JP | 2002-280253 | A | | 9/2002 | |
| JP | 2002280253 | A | * | 9/2002 | ............. H01G 4/252 |
| JP | 2016-105488 | A | | 6/2016 | |
| JP | 2016105488 | A | * | 6/2016 | ............... H01G 4/30 |
| KR | 10-2016-0090589 | A | | 8/2016 | |

* cited by examiner

[FIG. 1]
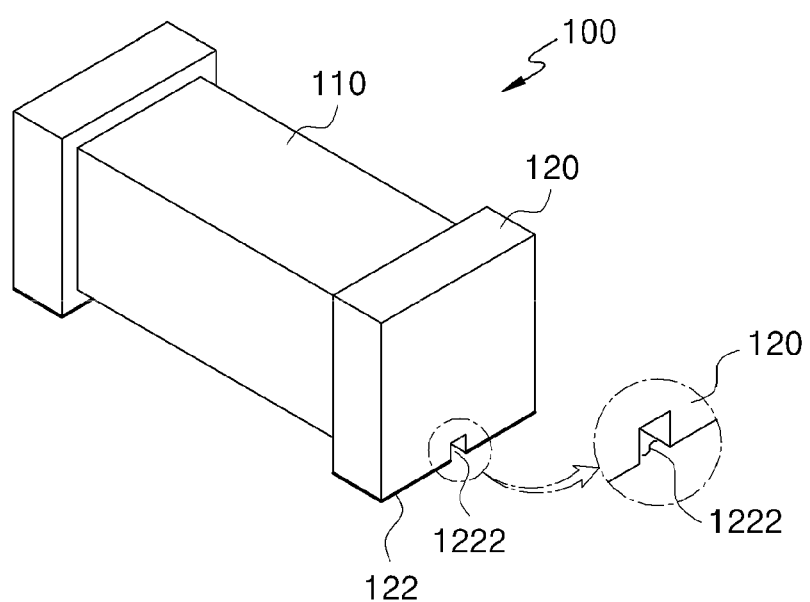

[FIG. 2]
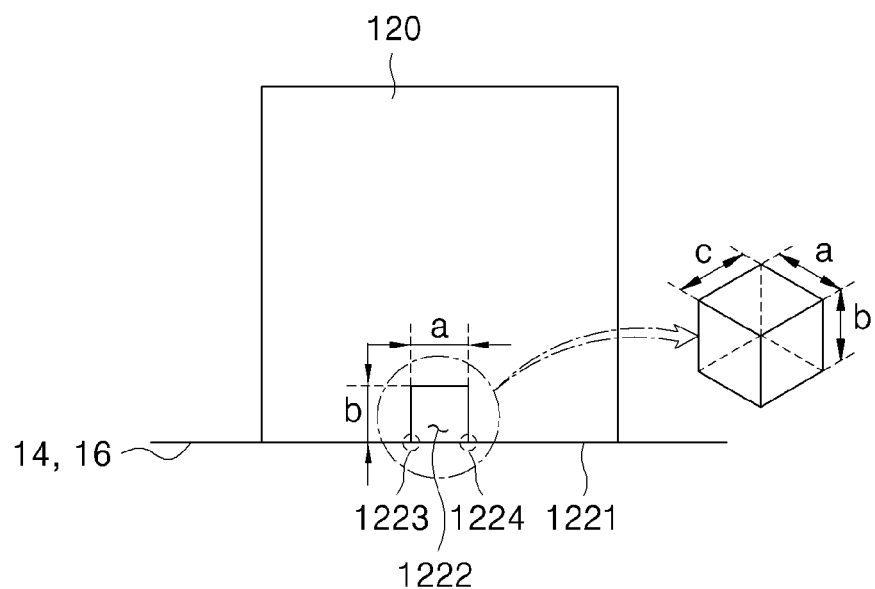
[FIG. 3]
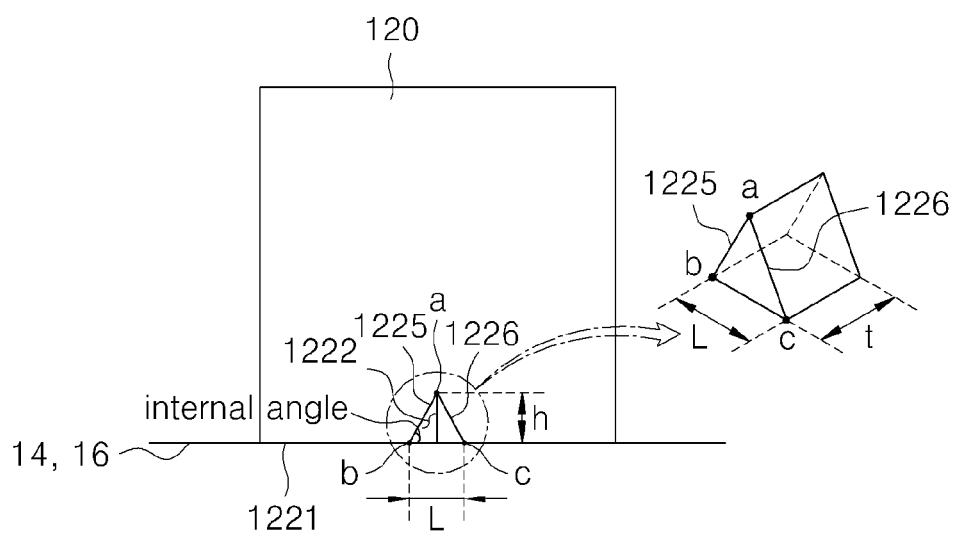

[FIG. 4]
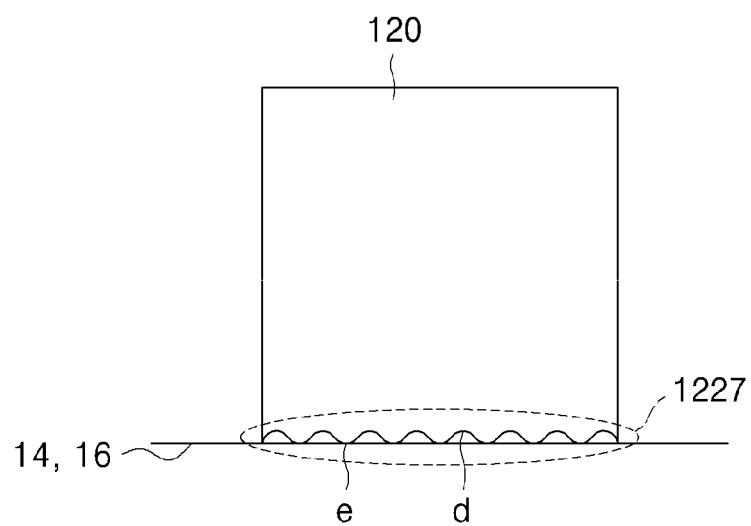

[FIG. 5]
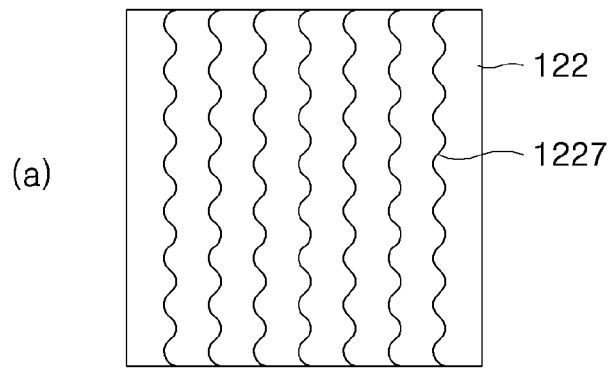
(a)
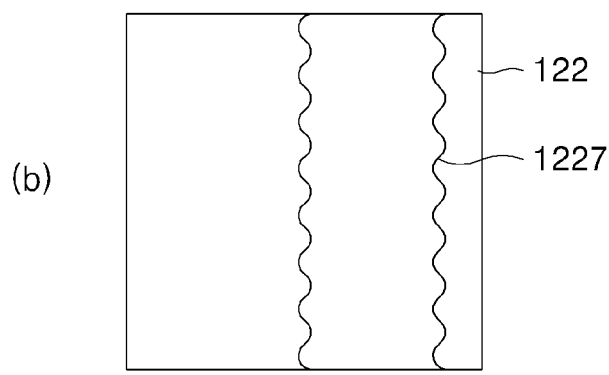
(b)
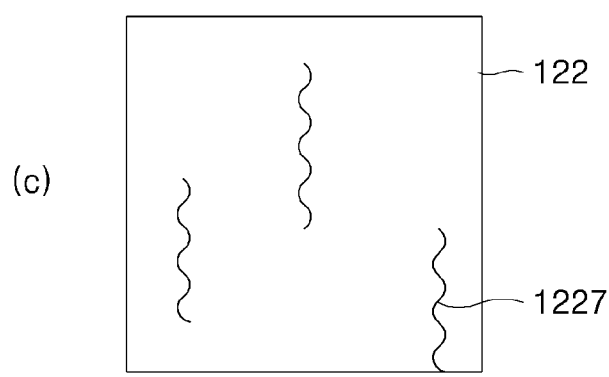
(c)

[FIG. 6]
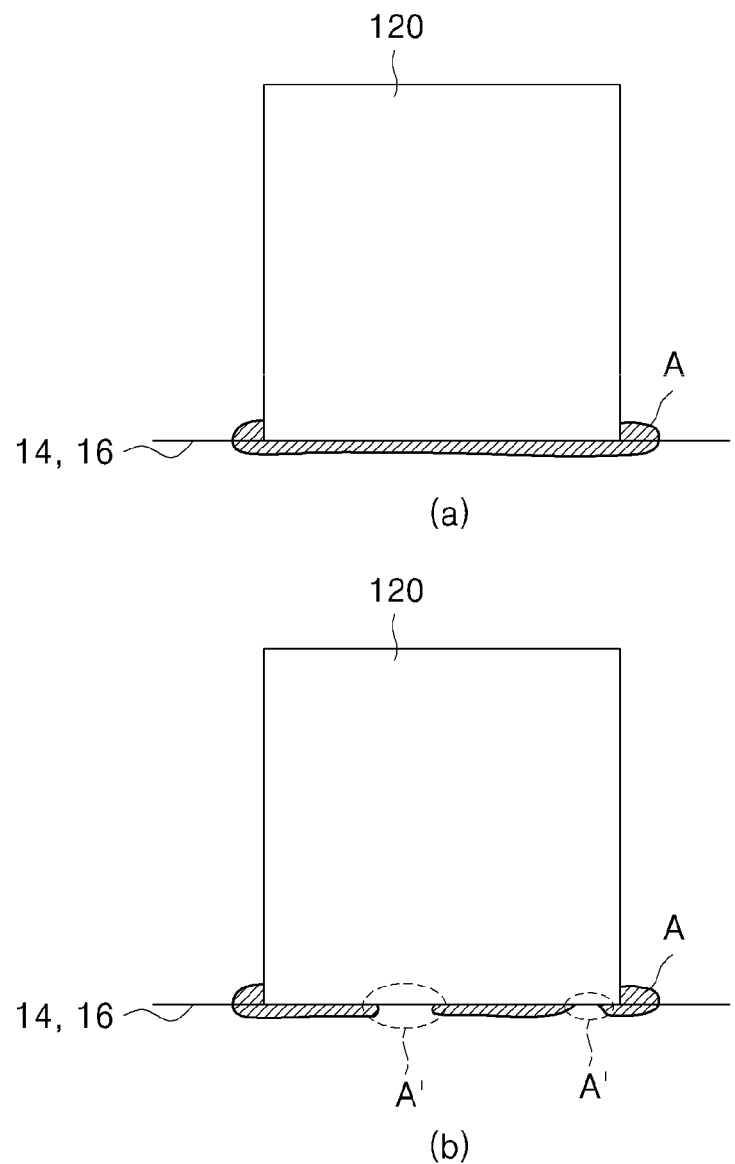

[FIG. 7]
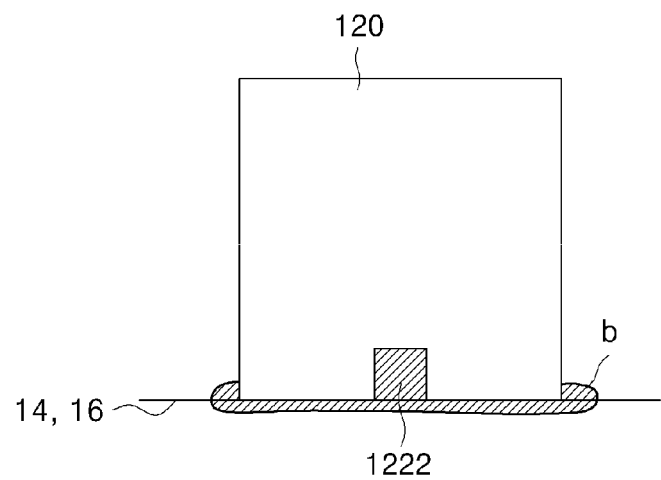
[FIG. 8]
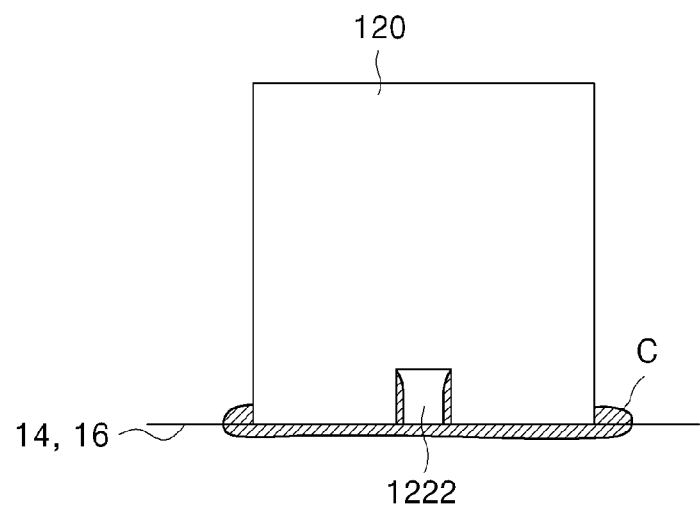

[FIG. 9]
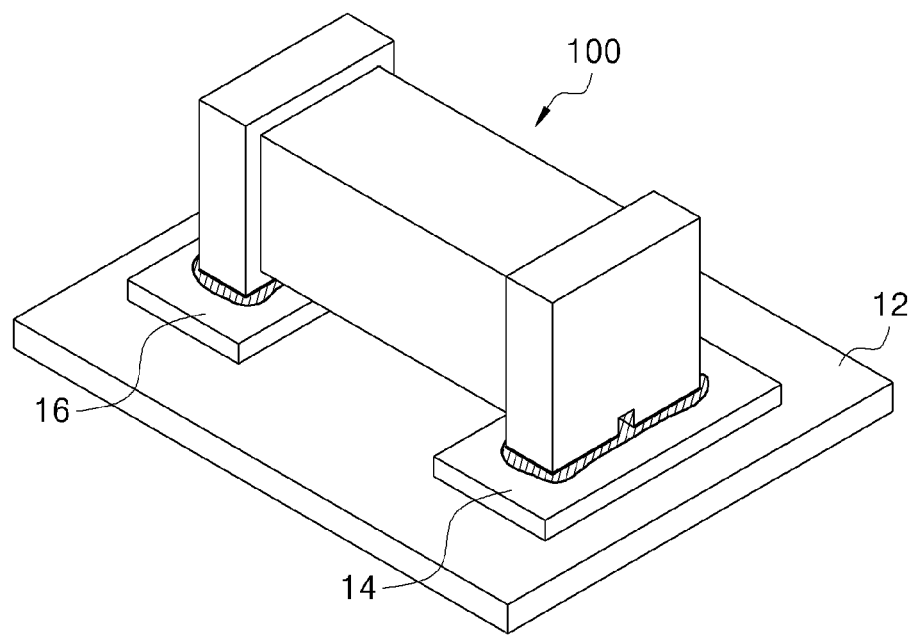

CHIP COMPONENT HAVING GROOVE FORMED THEREIN

CROSS-REFERENCE TO RELATED APPLICATION

This application claims priority to Korean Patent Application No. 10-2017-0058242 filed on May 10, 2017 and all the benefits accruing therefrom under 35 U.S.C. § 119, the contents of which are incorporated by reference in their entirety.

BACKGROUND

The present disclosure relates to a chip component, and more particularly, to a chip component for preventing a poor soldering phenomenon occurring in a surface mounting technique (SMT) operation.

As modern electronic components are continuously made to have lightweights and small sizes, surface mounting technique (SMT) operations are essential portion in the manufacturing processes of electronic components. The surface mounting technique (SMT) is a technique of mounting various components (semiconductors, diodes, and chips) on a printed circuit board (PCB) and bonding the components to the PCB by means of cream solder or the like to electrically connecting the components.

SMT processes include operations for respective processes. Among the SMT processes, a process, in which component terminals/chip components mounted on a PCB and pads of the PCB are soldered and metallically bonded by using cream solder or the like, is performed.

Meanwhile, during the metallically bonding process, when solder is not uniformly bonded to the pads of the PCB, a poor soldering phenomenon or the like, in which the solder is melted and separated even in a relatively low temperature when heat/shock is applied to the product, may occur. There is a possibility that such a poor soldering phenomenon may not be precisely checked even in an automatic optical inspection (AOI) which is a process of checking defects in component soldering after soldering operation, detecting the positions of defects, and inspecting exterior defects such as excessive solder, insufficient solder, short circuits, etc. In addition, defects of completed products are thereby caused.

SUMMARY

The present disclosure provides a chip component which is more stably bonded to pads of a PCB in a surface mounting technique (SMT) process.

In accordance with an exemplary embodiment, a laminated-type chip includes: a ceramic main body (110) in which a plurality of dielectric layers are laminated and which includes an internal electrode; an external electrode terminal (120) formed on both surfaces in the lengthwise direction of the ceramic main body; and a solder joint part (122) defined on a lower surface of the external electrode terminal and soldered to the electrode pad, wherein one or more soldering grooves (1222) having predetermined sizes are formed in a portion of the solder joint (122).

A cross-section of the soldering groove may have a rectangular shape including a first bent part (1223) and a second bent part (1224) which form an angle of 30 degrees or more with a bottom part (1221) of the outer electrode terminal.

The soldering groove (1222) may be a hexahedron including the cross-section of the rectangular shape, and each of the lengths of sides (a, b, and c) included in the hexahedron may be a length of 1.5-2.5 times the size of a solder particle.

A cross-section of the soldering groove may have a triangular shape including a first hypotenuse part (1225) and a second hypotenuse part (1226) which form predetermined internal angles with a bottom part (1221) of the external electrode terminal.

The predetermined internal angles may be 30 degrees or more.

Meanwhile, the solder joint part (122) may include an uneven part (1227) formed to include a recess portion (d) and a protruding portion (e).

A length of the soldering groove (1222) may be smaller than a width of the solder joint part (122).

Here, the solder joint part (122) may include a plurality of uneven parts (1227).

BRIEF DESCRIPTION OF THE DRAWINGS

Exemplary embodiments can be understood in more detail from the following description taken in conjunction with the accompanying drawings, in which:

FIG. 1 is a view illustrating a laminated-type chip in accordance with an exemplary embodiment;

FIG. 2 illustrates example 1 of a soldering groove;

FIG. 3 illustrates example 2 of a soldering groove;

FIG. 4 illustrates an exemplary embodiment of a solder joint part;

FIG. 5 illustrates various examples of FIG. 4;

FIG. 6 illustrates a solder joint state according to a related art;

FIG. 7 illustrates example 1 of a solder joint in accordance with an exemplary embodiment;

FIG. 8 illustrates example 2 of a solder joint in accordance with an exemplary embodiment; and FIG. 9 is a view illustrating a state in which a laminated-type chip in accordance with an exemplary embodiment is mounted on a printed circuit board.

DETAILED DESCRIPTION OF EMBODIMENTS

Hereinafter, embodiments of the present disclosure will be described in detail with reference to the accompanying drawings so that the present disclosure may easily be carried out by a person with ordinary skill in the art to which the invention pertains. The present disclosure may, however, be embodied in different forms and should not be construed as limited to the embodiments set forth herein. In the drawings, anything unnecessary for describing the present disclosure will be omitted for clarity, and like reference numerals in the drawings denote like elements.

Although the terms such as "first" and "second" are used herein to describe various elements, these elements should not be limited by these terms. The terms are only used to distinguish one component from other components. For example, without departing from the scope of the present invention, a first component may be referred to as a second component, and similarly, the second component may also be referred to as the first component. In the following description, the technical terms are used only for explaining a specific exemplary embodiment while not limiting the present disclosure. The terms of a singular form may include plural forms unless referred to the contrary.

In this disclosure below, when one part (or element, device, etc.) is referred to as being 'connected' to another part (or element, device, etc.), it should be understood that the former can be 'directly connected' to the latter, or 'electrically connected to the latter via an intervening part (or element, device, etc.). Furthermore, when it is described that one part "includes" some components, it does not mean that other components are excluded but means that other elements may be further included if there is no specific contrary indication. The terms "step of (performing)" or "step of (doing)" used in the entire specification of the present disclosure does not mean "step for".

Terms used in the present invention is selected as general terms as widely used as possible while considering functions in the present invention, but these may be changed according to intent of a person skilled in the art, a precedent, an advent of new technique, or the like. In addition, in a specific case, there are terms arbitrarily selected by applicants, and in this case, the meaning of the terms will be described in detail in the corresponding description part of the present invention. Accordingly, the terms used in the present invention should be defined on the basis of the meanings the terms have and the contents of the entirety of the present invention rather than defined by simple names of the terms.

FIG. 1 is a schematic view illustrating a laminated-type chip component 100 in accordance with an exemplary embodiment.

Referring to FIG. 1, a laminated-type chip component 100 may include a ceramic main body 110, external electrode terminals 120, solder joint parts 122, and soldering grooves 1222.

The ceramic main body 110 includes a plurality of dielectric layers (not shown) laminated therein and an internal electrode. The ceramic main body 110 may have a shape, for example, a hexahedral shape.

The external electrode terminals 120 are formed on both surfaces in the lengthwise direction of the ceramic main body 110. As the ceramic main body 110 is formed in, for example, a hexahedral shape, the external electrode terminals 120 may also have hexahedral shapes.

The solder joint parts 122 are portions, in which the external electrode terminals 120 are bonded to electrode pads 14 and 16 on a board, and may be set on lower surfaces of the external electrode terminals 120. Although not shown in detail in FIG. 1, a surface including a side depicted by thick lines on a lower portion of the external electrode terminals, that is, the lower surfaces of the external electrode terminals are set as the solder pint parts 122. In a general soldering process, surfaces of external electrode terminals 120 which are brought into contact with or bonded to electrode pads 14 and 16 on a board during soldering may be described as the solder joint parts 122.

As illustrated in FIG. 1, a groove 1222 having a predetermined size is formed in a central portion of the portion in which the external electrode terminals 120 are bonded to the pads 14 and 16 on the board 200, that is, the central portion of the solder joint part 122, and may be referred to as the soldering groove 1222.

The soldering grooves 1222 formed in the solder joint parts 122 may be filled with solder for bonding the external electrode terminals 120 of the laminated-type chip 100 to the electrode pads 14 and 16 on the board. To this end, wettability of solder which ascends along a metallic object is used. That is, due to the wettability, the solder contacting the solder joint parts 122 ascends along the soldering grooves 1222, so that not only the solder joint parts 122 but also the soldering grooves 1222 are filled with the solder and may thereby be bonded.

Thus, due to the soldering grooves 1222, the contact/bonded area of the solder is wider than that in an existing method in which solder joint is made only on a plane, and thus, the solder may be more stably bonded.

<Examples of Increasing Soldering Joint Area>

Example 1

In example 1, as illustrated in FIG. 1, soldering grooves 1222 may be formed in hexahedral shapes. This will be described in detail, with reference to FIG. 2 illustrating a cross-sectional view of a hexahedral soldering groove 1222.

Referring to FIG. 2, the cross-section of the hexahedral soldering groove 1222 has a shape of a rectangle which forms a first bent part 1223 and a second bent part 1224 which form a right angle with a bottom part 1221 of an external electrode terminal. That is, as illustrated in FIG. 2, the rectangle may be described to include: side 'b' forming the first bent part 1223 and the second bent part 1224, which are perpendicular to the bottom part 1221 of the external electrode terminal; and side 'a' corresponding to the bottom part 1221.

In addition, the first bent part 1223 and the second bent part 1224 may be formed so as to form an angle, which is not the right angle, with the bottom part 1221, and thus, the cross-section of the soldering groove 1222 may also be formed in a trapezoidal shape. At this point, the angles between the first bent part 1223 and the second bent part 1224, and the bottom part 1221 are preferably equal to or greater than 30 degrees.

For reference, the bottom part 1221 means sides at which the external electrode terminal 120 contacts or is bonded to pads 14 and 16, and may be described as sides included in the solder joint 122.

Referring to FIG. 2, in an exploded view of the soldering groove 1222 having a rectangular cross-section such that the first bent part 1223 and the second bent part 1224 are perpendicular to the bottom part 1221, the soldering groove 1222 may have a hexahedral shape configured from side 'a', side 'b', and side 'c'. To facilitate the understanding of description, it will be described that side 'a', side 'b', and side 'c' are respectively referred to the width, the height, and the depth of the hexahedron. That is, the soldering groove 1222 of example 1 has a hexahedral shape formed to include two surfaces configured from side 'a' and side 'c', two surfaces configured from side 'b' and side 'c', and two surfaces configured from side 'a' and side 'c'. When the hexahedral soldering groove 1222 is provided in the external electrode terminal 120, the soldering groove 1222 may be formed by considering the size of solder particle for effective bonding.

For example, the soldering groove 122 may be formed to have a size of 1.5-2.5 times the size of the solder particle, and may preferably be formed to have a size/space of approximately 2 times the size of the solder particle. Specifically, for example, considering that the size of solder particle generally used in soldering process is 25 µm, the soldering groove, which should be formed in a size of 2 times the size of the solder particle, may be formed to have a length, a width, and a height of 50 µm which is 2 times the 25 µm.

Accordingly, the hexahedral soldering groove 1222 may be formed in a size of 50 µm×50 µm×50 µm such that side 'a', side 'b', and side 'c' have the lengths of 50 µm. As described above, the soldering groove 1222 may be a regular hexahedron in which side 'a', side 'b', and side 'c' have the same length. But the embodiment is not limited thereto, and according to cases, the lengths of sides 'a', 'b', and 'c' may be changed within a range such that the soldering groove 1222 is stably soldered, and may also be different from each other.

Here, the length of the side 'c' may also be formed so as to be the same as the thickness of the external electrode 120, that is, formed by the entire width of the soldering joint part 122 which is the lower portion/lower surface of the external electrode 120, or also be formed in a smaller size smaller such that the soldering groove 1222 are formed in only a partial region in the width of the soldering joint part 122.

Thus, when the portion having the soldering groove 1222 in the external electrode terminal 120 is soldered to a pad on a board, solder is not only filled in the planar soldering joint part 122 but also additionally filled in the hexahedral soldering groove 1222 formed in the external electrode terminal 120, and thus, the contact area may be increased.

Example 2

In example 2, the cross-section of a soldering groove 1222 may have a triangular shape. Referring to FIG. 3, the cross-section of the soldering groove 1222 may be a triangle configured from a first hypotenuse part 1225 and a second hypotenuse part 1226 which form predetermined internal angles with a bottom part 1221 of an external electrode terminal 120.

Describing the cross-section of the triangle in more detail, it is supposed that points on the bottom part 1221 are referred to as point 'b' and point 'c', and the side formed by points 'b' and 'c' is referred as side 'L'. In addition, a point corresponding to side 'L' is referred to as point 'a'. Accordingly, the side formed by points 'b' and 'c' may be described as the first hypotenuse part 1225 and the side formed by points 'a' and 'c' may be described as the second hypotenuse part 1226. That is, the triangle of the soldering groove 1222 may be configured from side 'L' and the first hypotenuse part 1225, and side 'L' and the second hypotenuse part 1226 which form predetermined internal angles.

The predetermined internal angles may be, for example, an angle equal to or greater than 30 degrees. According to the size of the predetermined internal angles and side the height 'h' of the triangle, that is, the height of the soldering groove 1222 may vary.

For example, assuming that side 'L' has a constant length, and when the size of the internal angles formed by the first hypotenuse part 1225 and side and the second hypotenuse part and side 'L' are respectively 30 degrees, which is a first case, the height 'h' of the triangle, that is, the distance between side 'L' and the point 'a' is referred to as 'h1'. Also, when the size of the internal angles formed by the first hypotenuse part 1225 and side and the second hypotenuse part and side 'L' are respectively 45 degrees, which is a second case, the height 'h' of the triangle, that is, the distance between side 'L' and the point 'a' is referred to as 'h2'. In the second case, 'h2' is formed larger than in the first case, that is, in the case in which the size of the internal angle is formed at 30 degrees, and the shape of the soldering groove 1222 may be the shape in which the height of the soldering groove 1222 filled with solder is increased. That is, when the length of side 'L' is formed constant, the space/size of the soldering groove 1222 filled with solder may vary according to the internal angles formed by side 'L' and the first and second hypotenuse parts 1225 and 1226.

In the exemplary embodiment, setting the size of the internal angle within a range of 30 degrees or more is the most preferable case in which the soldering groove 1222 is stably soldered.

Examining the overall shape of the soldering groove 1222 having a triangular cross-section as such, the overall shape may be a triangular cylinder which includes: two rectangles each having the first hypotenuse part 1225, the second hypotenuse part 1226, and side 'L' as the lower side; one rectangle having the first hypotenuse part 1225 and side 't' as the lower side; one rectangle having the second hypotenuse part 1226 and side 't' as the lower side; and one rectangle having side 'L' and the side 't'.

Here, the length of lower side 't' may also be formed so as to be the same as the thickness of the external electrode 120, that is, formed by the entire width of the soldering joint part 122 which is the lower portion/lower surface of the external electrode 120, or also be formed in a smaller size such that the soldering groove 1222 is formed in only a partial region in the width of the soldering joint part 122.

Here, as in example 1, when the soldering groove 1222 is provided in the external electrode terminal 120, the soldering groove 1222 may be formed by considering the size of solder particle for effective bonding.

For example, the soldering groove 122 may be formed to have a size of approximately 2 times the size of the solder particle. Specifically, for example, considering that the size of solder particle generally used in soldering process is 25 μm, the soldering groove 1222 may be formed to have a size/space of approximately 2 times of the size of solder particle. Accordingly, the soldering groove 1222 having a shape of a triangular cylinder may be a triangular cylinder in which the first hypotenuse part 1225, the second hypotenuse part 1226, and side 't' have the same length of 50 μm. However, the exemplary embodiment is not limited thereto, and according to the cases, the shape may vary within a range in which the soldering groove 1222 is stably soldered. For example, the lengths of the sides '1' and T may be formed in a size of 1.5-2.5 times the size of solder particle.

Accordingly, when the external electrode terminal 120 having the triangular cylinder-shaped soldering groove 1222 is soldered on to the electrode pads 14 and 16 on the board, the bonded area may be increased by filling not only the solder joint part 120 but also the soldering groove 1222 with solder.

Example 3

In example 3, unlike examples 1 and 2, a soldering groove 1222 is not formed in an external electrode terminal 120 and a portion, in which the external electrode terminal 120 is bonded to electrode pads 14 and 16 on a board, that is, a solder joint part 122, may have an uneven shape. Referring to FIG. 4 which is a cross-sectional view of example 3, the solder joint 122 may include an uneven part 1227 which includes recessed portions and protruding portions 'e' which are regularly formed.

FIG. 4 is a cross-sectional view illustrating that the overall region of the solder joint part 122 is formed with the uneven part 1227. As illustrated in FIG. 4, the uneven part 1227 may be formed to include a plurality of recessed portions and a plurality of protruding portions 'e'. Accordingly, during soldering, solder is filled in the recessed portions 'd', and thus, the bonded area may be increased compared to the case of soldering on a plane.

Here, as illustrated in FIG. 4, the case in which the recessed portions and the protruding portions 'e' are formed to have constant heights and widths is the most preferable example. However, the recessed portions and the protruding portions 'e' are not necessarily formed to have constant heights and widths. The solder joint part 122 may also have shapes in which the uneven part 1227 is formed in the entire region thereof or in only a partial region thereof. In addition, a plurality of recessed portions and protruding portions 1227 formed in partial regions may be formed in the solder joint part 122.

Describing various shapes of example 3 with reference to FIG. 5, as illustrated (a) of FIG. 5, the solder joint 122 may have a shape in which the entire region thereof has the uneven parts 1227, or also have a shape in which only portions of the solder joint part 122 have uneven part 1227. As illustrated in FIG. 5, the direction, the shape, the length, the position, and the like of the uneven parts 1227 formed in the solder joint part 122 are not limited. However, as the area of the uneven parts 1227 included in the solder joint part 122 increases, the soldered area increases, and thus the external electrode 120 may be stably soldered to the electrode pads 14 and 16.

As illustrated in (c) of FIG. 5, in the shape in which the uneven parts 1227 are formed in only partial regions, although the uneven parts 1227 are each illustrated in the drawing as being formed as one uneven line, a plurality of uneven parts 1227 which include a plurality of uneven lines and have predetermined areas may be formed in the solder joint part 122.

FIG. 6 is a schematic cross-sectional view illustrating the shape in which an external electrode terminal 120 according to a related art is soldered on electrode pads 14 and 16 on a board. In (a) of FIG. 6, as indicated by region A, a soldered portion of the external electrode terminal 120 is in a state of being evenly soldered onto the electrode pads 14 and 16 on a board. However, as in (b) of FIG. 6, a region such as region A' in which a soldered portion of the external electrode terminal 120 is not evenly soldered onto the electrode pads 14 and 16, may occur. When soldering is not evenly performed as in region A', a poor soldering or the like in which solder is melted and separated at a relatively low temperature when heat/shock is applied.

Referring to FIGS. 7 and 8, cross-sectional views, in which an external electrode terminal 120 having a hexahedral soldering groove 1222 formed therein is soldered to electrode pads 14 and 16, are provided.

In an example, as illustrated in FIG. 7, not only a solder joint part 122 but also the entirety of a soldering groove 1222 may be filled with solder and soldered as in region B.

In another example, unlike the entirety of the soldering groove 1222 being filled with solder and soldered as illustrated in FIG. 8, solder may ascend along the entirety of or a portion of a side wall of the soldering groove 1222 and be soldered, as in region C.

The case, in which the side wall of the soldering groove 1222 is soldered as illustrated in FIG. 8, is a more preferred example than the case in which the entire soldering groove 1222 is filled with solder and soldered as illustrated in FIG. 7. However, according to various factors such as the size, the temperature, the pressure, or the like of a solder ball during a soldering process, the entire soldering groove 1222 may be soldered, or only the side wall of the soldering groove 1222 may be soldered.

While FIGS. 7 and 8 illustrate the shape in which the external electrode having the hexahedral soldering groove 1222 formed therein is soldered, the soldering groove 1222 having a triangular cross-section illustrated in FIG. 3 may be entirely soldered or only the side wall of the soldering groove 1222 may be soldered.

Accordingly, as illustrated in FIGS. 7 and 8, when a groove is formed in the solder joint part 122 in which the external electrode terminal 120 is soldered to a pad, the external electrode terminal 120 may be more stably bonded by increasing the area of soldering than in the case in which soldering is performed on a plane as illustrated in FIG. 6.

FIG. 9 is a schematic perspective view illustrating a state in which a laminated-type chip 100 in accordance with an exemplary embodiment is mounted on a circuit board.

Referring to FIG. 9, a mounting board 10, on which a laminated-type chip 100 is mounted, includes a circuit board 12, a first electrode pad 14, and a second electrode pad 16. A ceramic main body 110 of the laminated-type chip 100 is mounted on an upper surface of the circuit board 12. External electrode terminals 120 formed on both surfaces of the ceramic main body 110 in the lengthwise direction may be soldered to the first electrode pad 14 and a second electrode pad 16, respectively.

Here, the first electrode pad 14 and the second electrode pad 16 are formed on the circuit board 12 so as to be spaced a predetermined distance from each other. The predetermined distance will be a spacing distance corresponding to a distance between respective external electrode terminals 120.

Thus, the external electrode terminals 120 formed on both the surfaces of the ceramic main body 110 may be mounted on to the first electrode pad 14 and the second electrode pad 16, and soldered by using solder.

As in the above examples, the external electrode terminals 120 may have a groove 1222 in a portion soldered to the first electrode pad 14 and the second electrode pad 16. Thus, not only the surface on which the external electrode terminal, and the first electrode pad 14 or the second electrode pad 16 are bonded, that is, the solder joint part 122, but also the soldering groove 1222 may additionally be soldered, so that the bonded area may be increased and the external electrode terminal may be more stably bonded.

In accordance with exemplary embodiments, a groove is formed on a surface of a chip component bonded to a pad of a printed circuit board (PCB), so that the contact area with solder during soldering, and the chip component can be more stably bonded to the PCB.

So far, the technical idea of the present invention has been specifically described with respect to the above embodiments, but it should be noted that the foregoing embodiments are provided only for illustration while not limiting the present disclosure. Various embodiments may be provided to allow those skilled in the art to understand the scope of the preset invention, but the present invention is not limited thereto.

What is claimed is:

1. A laminated-type chip comprising:
   a ceramic main body in which a plurality of dielectric layers are laminated and which comprises an inner electrode; and
   an outer electrode terminal on both surfaces in a lengthwise direction of the ceramic main body, a solder joint part being defined on a lower surface of the outer electrode terminal to be soldered to an electrode pad,
   wherein one or more soldering grooves are defined in the lower surface of the outer electrode in the lengthwise direction at a portion of the solder joint part, and
   wherein each of a length, a width, and a depth of each soldering groove is 1.5 times to 2.5 times a size of a solder particle in the solder joint part.

2. The laminated-type chip of claim 1, wherein a cross-section of the soldering groove has a rectangular shape including a first bent part and a second bent part which form an angle of 30 degrees or more with a bottom part of the outer electrode terminal.

3. The laminated-type chip of claim 2, wherein the soldering groove is a hexahedron including the cross-section of the rectangular shape, and each of the lengths of sides of the hexahedron is 1.5 times to 2.5 times the size of the solder particle.

4. The laminated-type chip of claim 1, wherein a cross-section of the soldering groove has a triangular shape comprising: a first hypotenuse part and a second hypotenuse part which form predetermined internal angles with a bottom part of the outer electrode terminal.

5. The laminated-type chip of claim 4, wherein the predetermined internal angles are 30 degrees or more.

6. The laminated-type chip of claim 1, wherein the solder joint part comprises an uneven part formed to comprise a recessed portion and a protruding portion.

7. A laminated-type chip comprising:
- a ceramic main body in which a plurality of dielectric layers are laminated and which comprises an inner electrode; and
- an outer electrode terminal on both surfaces in a lengthwise direction of the ceramic main body, a solder joint part being defined on a lower surface of the outer electrode terminal to be soldered to an electrode pad,
- wherein one or more soldering grooves are defined in the lower surface of the outer electrode in the lengthwise direction at a portion of the solder joint part, and
- wherein the length of the soldering groove is smaller than the width of the solder joint part.

8. The laminated-type chip of claim 6, wherein the solder joint part comprises a plurality of uneven parts.

9. The laminated-type chip of claim 7, wherein the solder joint part comprises an uneven part formed to comprise a recessed portion and a protruding portion.

10. The laminated-type chip of claim 9, wherein the solder joint part comprises a plurality of uneven parts.

11. The laminated-type chip of claim 7, wherein each of a length, a width, and a depth of each soldering groove is 1.5 times to 2.5 times a size of a solder particle in the solder joint part.

12. The laminated-type chip of claim 7, wherein a cross-section of the soldering groove has a rectangular shape including a first bent part and a second bent part which form an angle of 30 degrees or more with a bottom part of the outer electrode terminal.

13. The laminated-type chip of claim 12, wherein the soldering groove is a hexahedron including the cross-section of the rectangular shape, and each of the lengths of sides of the hexahedron is 1.5 times to 2.5 times the size of a solder particle in the solder joint part.

14. The laminated-type chip of claim 7, wherein a cross-section of the soldering groove has a triangular shape comprising: a first hypotenuse part and a second hypotenuse part which form predetermined internal angles with a bottom part of the outer electrode terminal.

15. The laminated-type chip of claim 14, wherein the predetermined internal angles are 30 degrees or more.

* * * * *